(12) United States Patent
Sakai et al.

(10) Patent No.: US 9,169,553 B2
(45) Date of Patent: Oct. 27, 2015

(54) SEMICONDUCTOR DEVICE PRODUCING METHOD

(75) Inventors: Masanori Sakai, Takaoka (JP); Nobuhito Shima, Imizu (JP); Kazuyuki Okuda, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 13/156,025

(22) Filed: Jun. 8, 2011

(65) Prior Publication Data

US 2011/0300722 A1    Dec. 8, 2011

Related U.S. Application Data

(60) Continuation of application No. 12/403,667, filed on Mar. 13, 2009, now abandoned, which is a division of application No. 10/529,896, filed as application No. PCT/JP03/14162 on Nov. 6, 2003, now abandoned.

(30) Foreign Application Priority Data

Nov. 11, 2002    (JP) ................................ 2002-327193

(51) Int. Cl.
| C23C 16/00 | (2006.01) |
| C23C 16/44 | (2006.01) |
| C23C 16/455 | (2006.01) |

(52) U.S. Cl.
CPC ....... *C23C 16/4405* (2013.01); *C23C 16/45536* (2013.01)

(58) Field of Classification Search
USPC ............................ 427/579, 569, 578; 118/715
See application file for complete search history.

(56) References Cited

U.S. PATENT DOCUMENTS

| 5,484,484 | A | | 1/1996 | Yamaga et al. |
| 5,632,821 | A | * | 5/1997 | Doi .............................. 134/1.1 |
| 5,830,310 | A | | 11/1998 | Doi |
| 6,125,859 | A | * | 10/2000 | Kao et al. ...................... 134/1.1 |
| 6,279,503 | B1 | | 8/2001 | Choi et al. |
| 6,346,483 | B1 | | 2/2002 | Ikeda |
| 6,449,521 | B1 | | 9/2002 | Gupta |

(Continued)

FOREIGN PATENT DOCUMENTS

| EP | 1 154 037 A1 | 11/2001 |
| JP | 63-215037 A | 9/1988 |

(Continued)

*Primary Examiner* — Elizabeth Burkhart
(74) *Attorney, Agent, or Firm* — Birch, Stewart, Kolasch & Birch, LLP (57) ABSTRACT

A substrate processing device comprises a reaction vessel 11 forming a space receiving a substrate 1 and adapted to have a plurality of reaction gases supplied thereto to perform desired processing of the substrate, an exhaust port 16 formed in the reaction vessel 11 for exhausting the reaction vessel 11, and a gas supply system 70A, 70B for supplying at least a plurality of reaction gases into the reaction vessel 11, the gas supply system 70A, 70B including a cleaning gas supply unit for supplying a cleaning gas to perform desired processing of the substrate 1 to thereby remove adherents in the reaction vessel 11, and a post-processing gas supply unit for supplying a post-processing gas capable of removing the elements contained in the cleaning gas remaining in the reaction vessel 11 after the adherents have been removed by supplying the cleaning gas, the post-processing gas containing all of the reaction gases used in performing desired processing of the substrate.

3 Claims, 5 Drawing Sheets

(56) References Cited

U.S. PATENT DOCUMENTS

| | | |
|---|---|---|
| 2001/0029891 A1 | 10/2001 | Oh et al. |
| 2002/0007790 A1 | 1/2002 | Park |
| 2002/0073923 A1* | 6/2002 | Saito et al. .................... 118/715 |
| 2003/0013320 A1* | 1/2003 | Kim et al. .................... 438/778 |
| 2003/0024477 A1 | 2/2003 | Okuda et al. |
| 2004/0008336 A1 | 1/2004 | Lam et al. |
| 2006/0124058 A1 | 6/2006 | Sakai et al. |

FOREIGN PATENT DOCUMENTS

| | | | |
|---|---|---|---|
| JP | 4-24921 | A | 1/1992 |
| JP | 7-201749 | A | 8/1995 |
| JP | 7-201847 | A | 8/1995 |
| JP | 8-55804 | A | 2/1996 |
| JP | 8-241865 | A | 9/1996 |
| JP | 2726414 | B2 | 3/1998 |
| JP | 2809817 | A | 10/1998 |
| JP | 11-224858 | A | 8/1999 |
| JP | 2001-123271 | A | 5/2001 |
| JP | 2002-053963 | A | 2/2002 |
| JP | 2002-324760 | A | 11/2002 |
| JP | 2003-229425 | A | 8/2003 |
| JP | 4411215 | B2 | 2/2010 |

\* cited by examiner

SEMICONDUCTOR DEVICE PRODUCING METHOD

This application is a Continuation of co-pending application Ser. No. 12/403,667, filed on Mar. 13, 2009, now abandoned, which is a Divisional of application Ser. No. 10/529,896, filed on Dec. 27, 2005, and for which priority is claimed under 35 U.S.C. §120. Application Ser. No. 10/529,896 is the national phase of PCT International Application No. PCT/JP2003/014162 filed on Nov. 6, 2003 under 35 USC §371 and for which priority is claimed to JP 2002-327193 filed on Nov. 11, 2002. The entire contents of each of the above-identified applications are hereby incorporated by reference.

TECHNICAL FIELD

The present invention relates to a substrate processing apparatus, and more particularly, to a substrate processing apparatus for effecting cleaning after a substrate is subjected to desired processing.

BACKGROUND ART

A thermal CVD (Chemical Vapor Deposition) apparatus comprises a furnace. According to the thermal CVD apparatus, a plurality of raw material gases are mixed and allowed to flow into in the furnace, and a film is formed on a substrate. If the film is formed on the substrate, the film adheres not only to the substrate but also to an inner side of the furnace. If the film adhering to the inner side of the furnace is accumulated and becomes thicker, the film is peeled off, and this generates foreign material.

To avoid this, etching gas is allowed to flow at regular intervals, and cleaning is carried out to remove the film on the inner side of the furnace. When the film is SiN for example, DCS ($SiH_2Cl_2$: dichlorsilane) gas and non-plasma $NH_3$ gas are used as the raw material gas, and gas including F (fluorine) such as $NF_3$ and $ClF_3$ is used as the etching gas.

The film on the inner side of the furnace is removed by the cleaning, molecules including F (F component, hereinafter) adsorbs and bonds to the inner wall surface of the furnace and remains thereon immediately after the cleaning. The molecules are separated at the time of subsequent film forming operation onto the substrate and hinder the film formation, and the film forming speed is decreased. This is because that F has etching function, F reacts with Si of an SiN film formed on the substrate to form $SiF_4$ (gas), and Si is removed from the substrate. Another reason is that F reacts with reaction gas (DCS), and an amount of raw material gas is reduced.

For this reason, in the conventional thermal CVD apparatus, after the cleaning and before the film is formed on the substrate, the film is forcibly deposited on the inner side of the furnace. This is called film-preformation. With this film-preformation, F component is allowed to react with the raw material of the film or is encapsulated under the film (this is also called trap of F component) so that F component is reduced from an atmosphere in the furnace as much as possible and the film forming speed is recovered when a film is formed.

In recent years, SiN films can be formed also by an ALD (Atomic Layer Deposition) apparatus. In the ALD apparatus, DCS gas and $NH_3$ activated by plasma (also called $NH_3$ plasma or $NH_3$ radical) are used as the reaction gases, and these two reaction gases are alternately supplied and films are formed one atom layer by one atom layer. If the ALD apparatus is used, even at low temperature, it is possible to form a high quality film as high as that formed by the thermal CVD apparatus which requires high temperature process. However, even with the ALD apparatus, a film must be preformed after cleaning to remove the remaining F like the thermal CVD apparatus.

In the above-described conventional technique, elements including the cleaning gas are trapped by the film-preformation, and the elements are eliminated from an atmosphere in a reaction container as much as possible. For this purpose, it is necessary to carry out the film-preformation. Further, even if a thick film-preformation is carried out, the elements included in the cleaning gas can not effectively be eliminated from the atmosphere in the reaction container. Further, since it is necessary to add a thermal CVD film-forming nozzle in addition to a special-purpose buffer nozzle, the structure of the reaction container becomes complicated and costs thereof are increased. If the thermal CVD film-forming nozzle is added, there is a problem that foreign materials are generated due to film formation in the CVD film-forming nozzle, and this is not preferable.

Therefore, it is a main object of the present invention to provide a substrate processing apparatus capable of effectively eliminating elements included in cleaning gas.

It is another object of the invention to provide a substrate processing apparatus capable of effectively preventing foreign materials from generating from a gas supply system, and to eliminate the need of the gas supply system itself.

DISCLOSURE OF THE INVENTION

According to a first aspect of the present invention, there is provided a substrate processing apparatus, comprising:

a reaction container which accommodates a substrate, to which a plurality of reaction gases are supplied, and which forms a space where said substrate is subjected to desired processing, an exhaust port which is opened in said reaction container for exhausting gas from said reaction container, and a gas supply system for supplying at least the plurality of reaction gases to said reaction container, wherein said gas supply system comprises a cleaning gas supply unit for supplying cleaning gas which removes accretion adhering to an inner side of said reaction container by subjecting said substrate to the desired processing, a post-processing gas supply unit for supplying post-processing gas which can remove an element included in the cleaning gas remaining in said reaction container after the accretion is removed by supplying the cleaning gas, and said post-processing gas includes all reaction gases used when said substrate is subjected to the desired processing.

According to a second aspect of the present invention, there is provided a substrate processing apparatus which supplies a plurality of reaction gases alternately and forms a thin film on a substrate, comprising:

a reaction container, a plurality of exclusive supply nozzles for respectively and exclusively supplying the reaction gases, and a control apparatus for controlling the substrate processing apparatus such that cleaning gas is supplied from one of the supply nozzles into said reaction container at a time of cleaning, all reaction gases used for processing a substrate are alternately supplied into said reaction container from the exclusive supply nozzles after the cleaning gas is supplied and before the substrate is processed.

PREFERABLE MODE FOR CARRYING OUT THE INVENTION

According to a preferable embodiment of the present invention, there is provided a first substrate processing apparatus comprising:

a reaction container which accommodates a substrate, to which a plurality of reaction gases are supplied, and which forms a space where said substrate is subjected to desired processing, an exhaust port which is opened in said reaction container for exhausting gas from said reaction container, and a gas supply system for supplying at least the plurality of reaction gases to said reaction container, wherein said gas supply system comprises a cleaning gas supply unit for supplying cleaning gas which removes accretion adhering to an inner side of said reaction container by subjecting said substrate to the desired processing, a post-processing gas supply unit for supplying post-processing gas which can remove an element included in the cleaning gas remaining in said reaction container after the accretion is removed by supplying the cleaning gas, and said post-processing gas includes all reaction gases used when said substrate is subjected to the desired processing.

Here, the desired processing includes a thin film formation by vapor phase epitaxy or surface reaction, processing for working or machining a substrate, such as formation of an oxide film, dispersion processing and the like.

Since the post-processing gas which can remove element included in the cleaning gas from the reaction container is supplied from the post-processing gas supply unit, the element included in the cleaning gas can be removed also from the reaction container as compared with a case in which a film is preformed in the reaction container and the element is trapped. Since the post-processing gas supply unit supplies to a substrate, as post-processing gases, all reaction gases used when said substrate is subjected to the desired processing, the reaction gases react with element included in the cleaning gas to produce volatile material, and the produced volatile material can effectively be removed from the reaction container. If the post-processing gas supply unit comprises gas supply means which supplies all reaction gases used when the substrate is subjected to desired processing, it is unnecessary to newly add a gas supply system, the structure does not become complicated. Further, foreign material from a gas supply system generated when the gas supply system is added can be prevented from being generated.

According to another preferred embodiment of the invention, in the first substrate processing apparatus, there is provided a second substrate processing apparatus, wherein said post-processing gas supply unit includes exclusive supply nozzles for independently supplying each of the reaction gases, and when the reaction gases are to be supplied as the post-processing gases, the reaction gases are alternately supplied from the exclusive supply nozzles.

In the second substrate processing apparatus, the post-processing gas supply unit can alternately supply reaction gases as post-processing gases from the exclusive supply nozzles which respectively supply a plurality of reaction gases used when a substrate is subjected to desired processing. Thus, gases supplied from the exclusive supply nozzles effectively affect elements included in the cleaning gases remaining in the exclusive supply nozzles and thus, it is possible to effectively remove the elements included in the cleaning gases remaining in the exclusive supply nozzles. In this case, examples of combination between a method in which a substrate is subjected to desired processing and a method in which the post-processing is carried out are ALD method+ALD method, and thermal CVD method+ALD method.

According to still another preferred embodiment of the invention, in the second substrate processing apparatus, there is provided a third substrate processing apparatus in which each of the reaction gases supplied from said post-processing gas supply unit remove the element remaining in said exclusive supply nozzles and said reaction container, and form a desired film in said reaction container.

In the third substrate processing apparatus, the post-processing gas supply unit can supply reaction gases for removing elements remaining in the exclusive supply nozzles and the reaction container. Thus, it is possible to effectively remove, from the reaction container, elements remaining in the exclusive supply nozzles and the reaction container. If the post-processing gas supply unit can supply reaction gases for forming a desired film, i.e., for performing a film on the reaction container, element remaining in the reaction container can be encapsulated in the preformed film. Therefore, remaining element can be eliminated from the atmosphere in the reaction container from both removal and encapsulation and thus, reduction in film forming speed caused by the remaining element can be avoided. If the reaction gases can alternately be supplied, the desired films formed in the exclusive supply nozzles and the reaction container may be thin, and the throughput is enhanced.

According to still another preferred embodiment of the invention, in the third substrate processing apparatus, there is provided a fourth substrate processing apparatus, wherein the plurality of reaction gases supplied from the exclusive supply nozzles are a gas including silicon, and ammonia gas activated by plasma.

In the fourth substrate processing apparatus, the gas including silicon can effectively eliminate element included in the cleaning gas remaining in the exclusive supply nozzle which supplies gas including silicon from the atmosphere in the reaction container. The ammonia gas activated by plasma can effectively eliminate element included in the cleaning gas remaining in the exclusive supply nozzle which supplies the ammonia gas from the atmosphere in the reaction container.

According to still another preferred embodiment of the invention, in the fourth substrate processing apparatus, there is provided a fifth substrate processing apparatus, wherein the cleaning gas is a gas including fluorine, and the gas including fluorine is supplied from the exclusive supply nozzle which supplies a gas including silicon.

In the fifth substrate processing apparatus, since a film is easily formed using gas including silicon as compared with ammonia gas, more accretions adhere to the exclusive supply nozzle which supplies gas including silicon as compared with the exclusive supply nozzle which supplies ammonia gas. Therefore, if gas including fluorine is supplied as cleaning gas from the exclusive supply nozzle which supplies gas including silicon, the accretions in the exclusive supply nozzle which supplies gas including silicon can be removed, and the exclusive supply nozzle can effectively be cleaned.

According to still another preferred embodiment of the invention, in the fourth or fifth substrate processing apparatus, there is provided a sixth substrate processing apparatus, wherein the gas including silicon is DCS ($SiH_2Cl_2$).

According to still another preferred embodiment of the invention, in the fifth substrate processing apparatus, there is provided a seventh substrate processing apparatus, wherein the gas including fluorine is $NF_3$ or $ClF_3$.

According to still another preferred embodiment of the invention, there is provided an eighth substrate processing apparatus which supplies a plurality of reaction gases alternately and forms a thin film on a substrate, comprising:
a reaction container,
a plurality of exclusive supply nozzles for respectively and exclusively supplying the plurality of the reaction gases, and
a control apparatus for controlling the substrate processing apparatus such that cleaning gas is supplied from one of the supply nozzles into said reaction container at a time of cleaning, all reaction gases used for processing a substrate are alternately supplied into said reaction container from the exclusive supply nozzles after the cleaning gas is supplied and before the substrate is processed.

According to still another preferred embodiment of the invention, there is provided a first semiconductor device producing method for producing a semiconductor device using a substrate processing apparatus in which all reaction gases used when a substrate is processed are supplied to the reaction container after the process for cleaning the inside of the reaction container and an element included in the cleaning gas supplied into the reaction container is removed.

If a semiconductor device is produced using a substrate processing apparatus in which all reaction gases used when a substrate is processed are supplied to the reaction container after the process for cleaning the inside of the reaction container and element included in the cleaning gas supplied into the reaction container is removed, the element remaining in the reaction container can effectively be removed, reduction in film forming speed caused by the element is prevented at the time of film forming process which is carried out the cleaning process, and it is possible to produce a high quality semiconductor device in which the film forming amount is stable.

According to still another preferred embodiment of the invention, in the first semiconductor device producing method, there is provided a second semiconductor device producing method wherein the reaction gases are supplied from the respective exclusive supply nozzles to the reaction container, and the process for removing element included in the cleaning gas includes process for alternately supplies the reaction gases from the exclusive supply nozzles.

In the second semiconductor device producing method, the reaction gases are supplied from the respective exclusive supply nozzles to the reaction container, and the process for removing element included in the cleaning gas includes process for alternately supplies the reaction gases from the exclusive supply nozzles. Therefore, it is possible to remove the elements remaining in the reaction container and the exclusive supply nozzles, the reduction in film forming speed caused by the elements can further be prevented at the time of film forming process which is carried out after the cleaning process, and a high quality semiconductor device having further stable film thickness can be produced.

According to still another preferred embodiment of the invention, in the second semiconductor device producing method, there is provided a third semiconductor device producing method wherein the process for removing elements included in the cleaning gas includes the process for removing the element remaining in the exclusive supply nozzles and the reaction container, and the process for forming a desired film on a constituent surface in the reaction container.

In the third semiconductor device producing method the process for removing elements included in the cleaning gas includes the process for removing the element remaining in the exclusive supply nozzles and the reaction container, and the process for forming a desired film on a constituent surface in the reaction container. Thus, it is possible to remove the elements remaining in the reaction container and the exclusive supply nozzles, and to encapsulate the elements in the film formed in the reaction container. The reduction in film forming speed caused by the elements can further be prevented at the time of the film forming process which is carried out after the cleaning process, and a high quality semiconductor device having further stable film thickness can be produced.

According to still another preferred embodiment of the invention, in the first to third semiconductor device producing methods, there is provided a fourth semiconductor device producing method, wherein the plurality of reaction gases are a gas including silicon and ammonia gas.

In the fourth semiconductor device producing method, preferably, the ammonia gas is ammonia gas activated by plasma. If the plurality of reaction gases are gas including silicon and ammonia activated by plasma, the elements remaining in the exclusive supply nozzles can be removed. The reduction in film forming speed caused by the elements remaining in the reaction container and the exclusive supply nozzles can further be prevented at the time of the film forming process which is carried out after the cleaning process, and a high quality semiconductor device having further stable film thickness can be produced.

According to still another preferred embodiment of the invention, in the fourth semiconductor device producing method, there is provided a fifth semiconductor device producing method wherein the cleaning gas is gas including fluorine, and the cleaning gas is supplied to the reaction container from the supply nozzle which supplies gas including silicon.

In the fifth semiconductor device producing method, the cleaning gas is gas including fluorine, and the cleaning gas is supplied to the reaction container from the supply nozzle which supplies gas including silicon. Therefore, it is possible to effectively remove the accretions in the exclusive supply nozzle which supplies gas including silicon which can easily form a film as compared with ammonia gas, and the inside of the exclusive supply nozzle can be cleaned effectively, and it is possible to produce a semiconductor device which suppresses affect of foreign materials.

According to still another preferred embodiment of the invention, in the fourth or fifth semiconductor device producing method, there is provided a sixth semiconductor device producing method, wherein the gas including silicon is DCS ($SiH_2Cl_2$).

According to still another preferred embodiment of the invention, in the fifth semiconductor device producing method, there is provided a seventh semiconductor device producing method, wherein the gas including fluorine is $NF_3$ or $ClF_3$.

Next, a preferred embodiment of the present invention will be explained in more detail with reference to the drawings.

Figure 5:
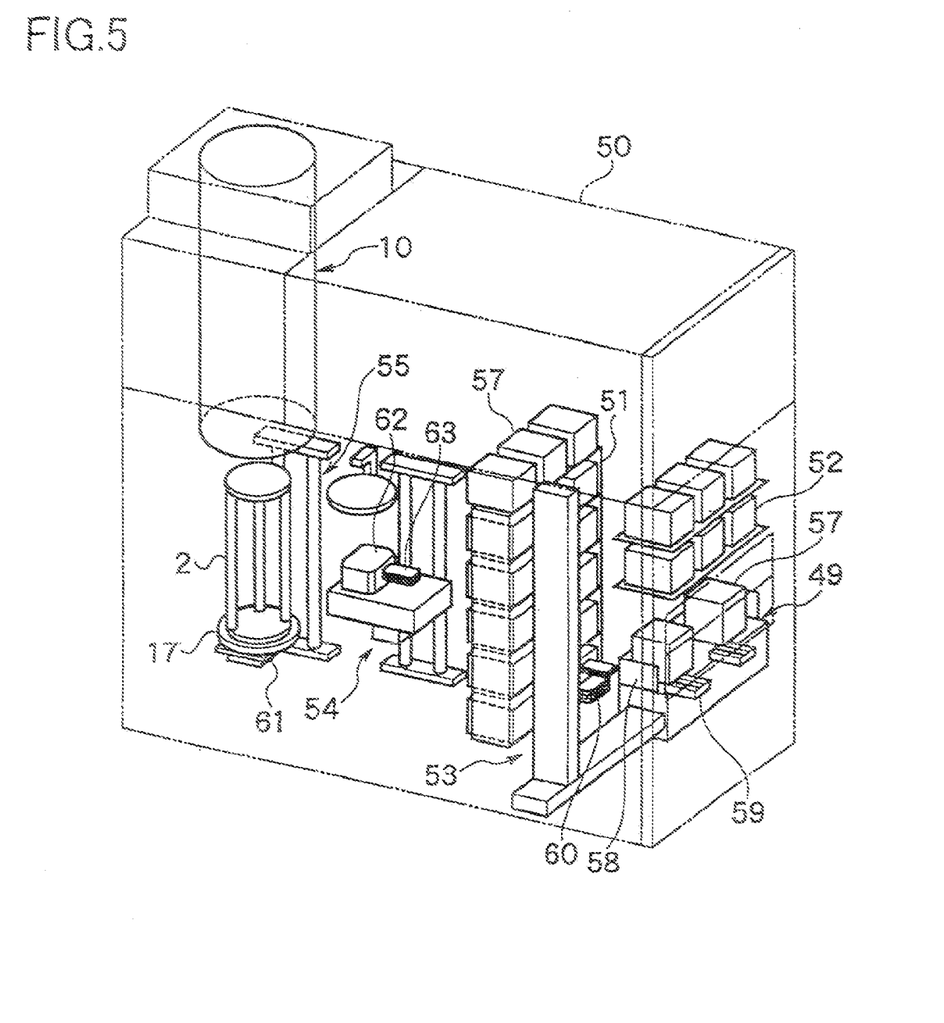
FIG. 5 shows an outline entire structure of the vertical ALD apparatus according to the embodiment of the invention.

FIG. 5 shows an outline entire structure of a vertical ALD apparatus according to the embodiment of the invention. A substrate processing apparatus 50 is provided at its front surface with a cassette delivery/receiving unit 49. In the substrate processing apparatus 50, a cassette shelf 51 is provided such as to be opposed to the cassette delivery/receiving unit 49, and a spare cassette shelf 52 is provided above the cassette delivery/receiving unit 49. A cassette transfer unit 53 is provided with the cassette delivery/receiving unit 49 and the cassette shelf 51, and a substrate loader 54 is provided behind the cassette shelf 51. A boat elevator 55 is provided behind the substrate loader 54, and a vertical reaction furnace 10 is provided above the boat elevator 55.

The cassette delivery/receiving unit 49 includes a cassette stage 58 on which two cassettes 57 can be placed. The cassette 57 is a substrate transfer container. The cassette delivery/receiving unit 49 also includes two substrate-posture aligners 59 below the cassette stage 58. If the cassettes 57 transferred by an external transfer apparatus (not shown) are placed on the cassette stage 58 in a vertical posture (i.e., wafers 1 accommodated in the cassettes 57 are in a vertical posture), the substrate-posture aligners 59 align the postures of the wafers such that notches and orientation flats of substrates (not shown) such as wafers in the cassette 57 are located at the same positions.

The cassette stage 58 is rotated through 90° to set the cassettes 57 horizontally so that the cassette transfer unit 53 can transfer the cassettes 57.

The cassette transfer unit 53 includes a robot arm 60 which can move forward and backward in the longitudinal direction, and the robot arm 60 can move laterally and vertically. The cassettes 57 are transferred from the cassette stage 58 to the cassette shelf 51 or the spare cassette shelf 52 by combination of longitudinal, vertical and lateral movements of the robot arm 60.

An arm 61 extends from the boat elevator 55. The arm 61 is provided with a seal cap 17. A boat which is a substrate holder is placed on the seal cap 17. The boat 2 holds the multi-stacked wafers in their horizontal postures. The wafers are brought into and out from the vertical reaction furnace 10 by the boat elevator 55.

The substrate loader 54 can rotate and vertically move, and includes a wafer holder 62 which can move forward and backward. The wafer holder 62 has a plurality of wafer holding plates 63, and each wafer holding plate 63 can holds a plurality of wafers collectively, or can hold one wafer.

The substrate loader 54 loads a plurality of wafers collectively or one by one to the boat 2 which is lowered from the cassette 57 of the cassette shelf 51.

If the necessary number of wafers are loaded onto the, the boat 2 is inserted into the vertical reaction furnace 10, and the wafers are subjected to processing. The ALD method is used for this wafer processing, and a plurality kinds of raw material gases as reaction gas are used for the processing. In the processing, the raw material gases are alternately supplied onto the wafers one kind by one kind, adsorption and reaction of the gasses are repeated one atom layer by one atom layer, thereby carrying out the processing.

The processed substrates are loaded on the cassettes 57 of the cassette shelf 51 through a reversed operation of the above-described operation, the substrates are transferred to the cassette delivery/receiving unit 49 by the cassette transfer unit 53, and are transferred out by the external transfer apparatus (not shown).

Figure 2:
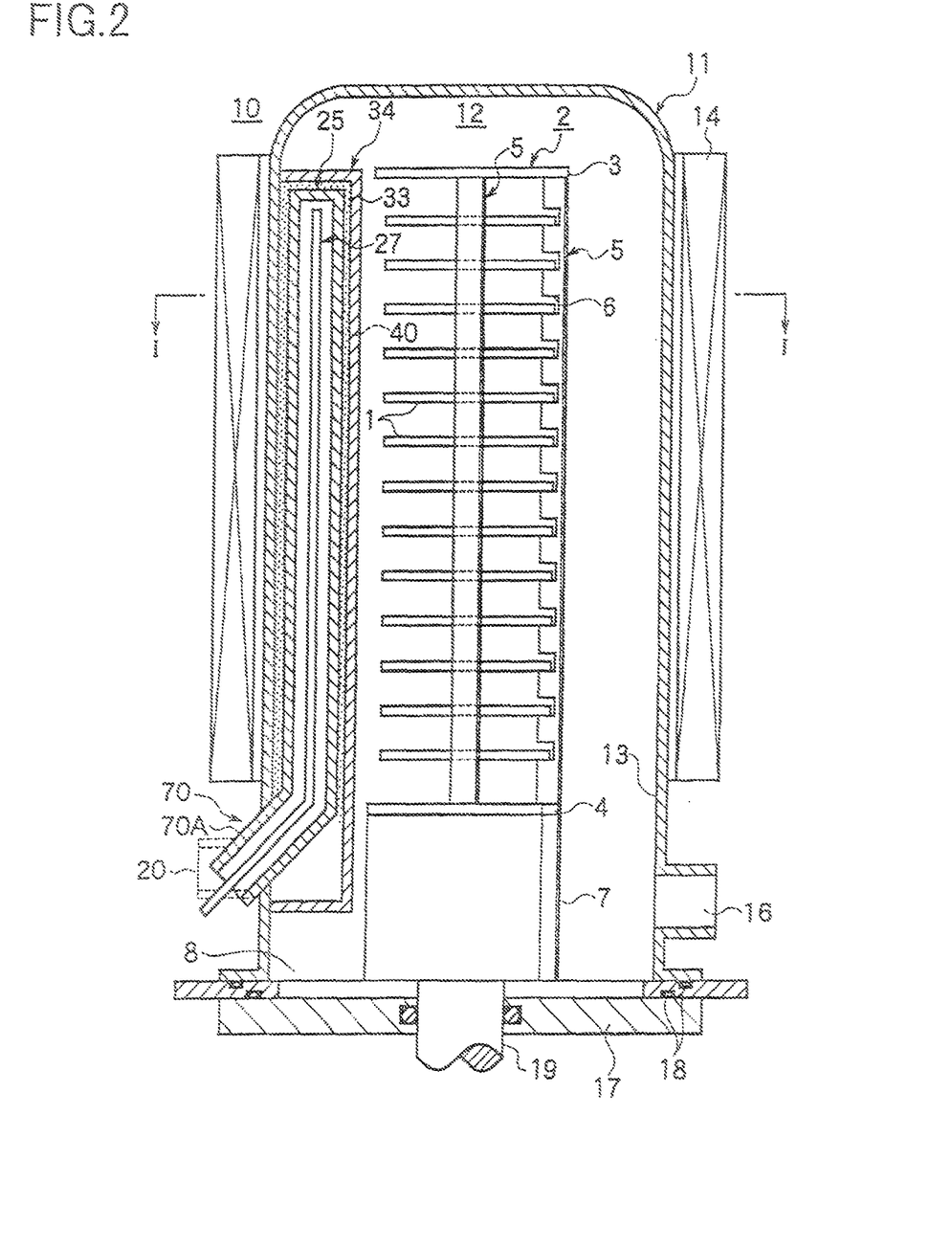
FIG. 2 is a schematic vertical sectional view of a furnace constituting the vertical ALD apparatus according to the embodiment of the present invention.

FIG. 2 shows a structure of the vertical reaction furnace 10 (simply furnace 10, hereinafter) of the vertical ALD apparatus of the embodiment. The furnace 10 includes a heater 14 and a cylindrical quartz reaction tube 11 as a reaction container provided inside the heater 14. A reaction chamber 12 which is a substrate processing region is formed in the reaction tube 11. A furnace opening of the reaction tube 11 is occluded air-tightly by the seal cap 17. The boat 2 stands on a quartz cap 7 provided on the seal cap 17. The boat 2 is inserted into the reaction tube 11. The boat 2 includes a plurality of columns 5 standing between a top plate 3 and a bottom plate 4. These columns 5 are provided with grooves 6 formed at distances from one another in the vertical direction. In the boat 2, the wafers 1 are held horizontally in a multi-stacked manner in the grooves 6. The boat 2 is vertically movably supported by the boat elevator 55 (see FIG. 5) and the boat 2 can be brought into and out from the reaction tube 11. The boat 2 is rotated around the rotation shaft 19 in the reaction tube 11 by a rotation mechanism (not shown). A reference number 18 represents a sealing O-ring.

The reaction tube 11 is provided with gas supply means 70. The plurality of reaction gases are supplied from the gas supply means 70 into the reaction tube 11. The gas supply means 70 includes a cleaning gas supply system and a post-processing gas supply system. The reaction tube 11 is provided with an exhaust port 16 as an exhaust system, and it is possible to exhaust gas from the reaction tube 11.

Although only one gas supply means 70 is shown in FIG. 2 as a matter of convenience, there are provided a plurality of gas supply means in the actually case so that a plurality kinds of raw material gases (here, two raw material gases) can be supplied into the reaction tube 11. One or a portion of the plurality kinds of raw material gases is gas which is activated by plasma and supplied, and the remainder is gas which is not activated by plasma and supplied. For example, a film to be formed on the substrate is SiN film, the raw material gases includes $NH_3$ gas which is required to be activated, and DCS gas which is not required to be activated. The gas supply means 70 shown here is first gas supply means ($NH_3$ gas supply means) 70A which supplies $NH_3$ gas activated by plasma. The first gas supply means 70A includes an $NH_3$ gas introducing port 20 provided on the one side at a lower portion of the reaction tube 11, and a quartz $NH_3$ buffer nozzle 34 which is connected to the $NH_3$ gas introducing port 20 and provided in the reaction tube 11. The $NH_3$ buffer nozzle 34 equalizes the flow rate and the velocity of flow of $NH_3$ gas introduced into the reaction tube 11 over the all wafers.

The $NH_3$ buffer nozzle 34 extends in an axial direction of the reaction tube 11 along the tube inner wall 13 from the lower portion of the reaction tube 11 to a portion in the vicinity of a top of the reaction tube 11 where a top of the boat 2 is located. As compared with a normal nozzle whose diameter is uniformly small, the $NH_3$ buffer nozzle 34 has a relatively wide nozzle space, and $NH_3$ gas is injected into the reaction tube 11 through the nozzle space. The $NH_3$ buffer nozzle 34 is provided with a large number of injection holes (not shown) with the same pitch as adjacent wafers 1 such as to correspond to the large number of wafers 1 held in the multi-stacked manner in the vertical direction.

The $NH_3$ buffer nozzle 34 is provided therein with a pair of plasma electrodes 27 (since the electrodes are superposed on each other, only one of them is shown in the drawing) for generating plasma, and the introduced $NH_3$ gas is activated with plasma. The pair of plasma electrodes 27 are respectively inserted into a pair of electrode protection tubes 25 provided in the $NH_3$ buffer nozzle 34. Plasma 40 is formed in a plasma producing region 33 sandwiched between the pair of electrode protection tubes 25.

Figure 1:
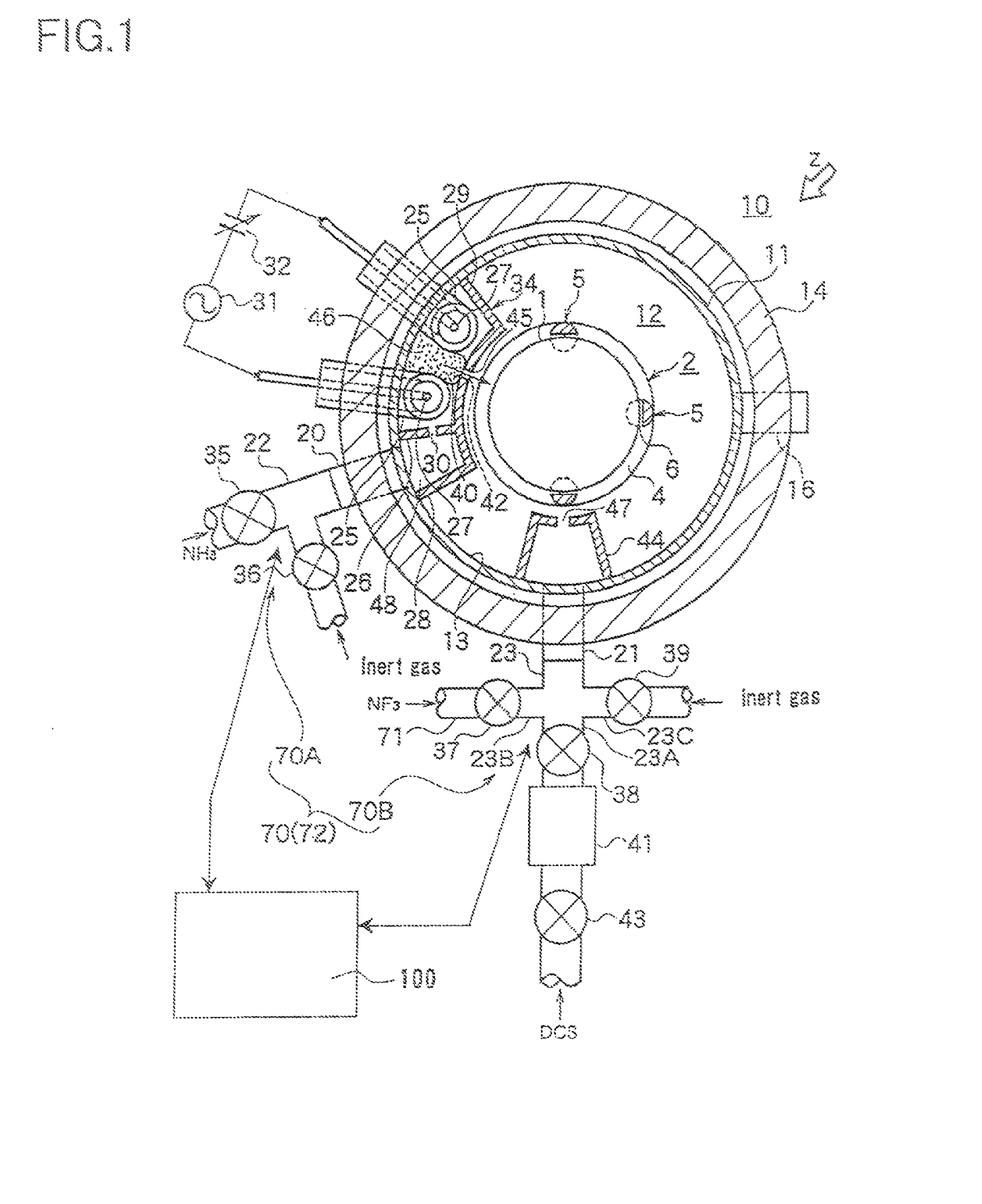
FIG. 1 is a schematic transverse sectional view of a furnace constituting a vertical ALD apparatus according to an embodiment of the present invention.

FIG. 1 is a sectional view taken along the line I-I in FIG. 2. There are provided the first gas supply means ($NH_3$ gas supply means) 70A and a second gas supply means (DCS gas supply means) 70B so that two kinds of raw material gases can individually be introduced into the reaction tube 11. The first gas supply means 70A and the second gas supply means 70B are connected to a control apparatus 100 and controlled by the control apparatus 100. The first gas supply means 70A includes an $NH_3$ gas introducing tube 22, an $NH_3$ gas introducing port 20 connected to the $NH_3$ gas introducing tube 22, and the $NH_3$ buffer nozzle 34 which is in communication with the $NH_3$ gas introducing port 20. The second gas supply means 70B includes a DCS gas introducing tube 23, a DCS gas introducing port 21 connected to the DCS gas introducing tube 23, and a DCS buffer nozzle 44 which is in communication with the DCS gas introducing port 21.

The first gas supply means 70A supplies $NH_3$ gas which is one of the two kinds of raw material gases into the reaction chamber 12 from the $NH_3$ buffer nozzle 34 as an exclusive supply nozzle. The first gas supply means 70A also supplies $NH_3$ gas or inert gas such as $N_2$ which is post-processing gas into the reaction chamber 12 from the $NH_3$ buffer nozzle 34. The $NH_3$ gas is activated by plasma and supplied at the time of film forming operation and at the time of post-processing.

The $NH_3$ buffer nozzle 34 includes a gas introducing nozzle portion 28 connected to the $NH_3$ gas introducing port 20, and a plasma producing nozzle portion 29 for activating gas. The gas introducing nozzle portion 28 and the plasma producing nozzle portion 29 are provided side by side with a division wall 26 interposed therebetween, and are brought into communication with each other through a communication port 30 provided in the division wall 26. The plasma producing nozzle portion 29 is provided with the pair of plasma electrodes 27 for generating plasma so that the introduced gas can be activated by the plasma 40. The activated $NH_3$ gas 42 is injected from an injection hole 45 formed in the plasma producing nozzle portion 29. The pair of plasma electrodes 27 are respectively inserted into the pair of electrode protection tubes 25 provided in the plasma producing nozzle portion 29. The pair of plasma electrodes 27 are introduced out from the furnace 10 through the electrode protection tubes 25 and are connected to a high frequency power supply 31 through a variable capacity aligner 32.

The $NH_3$ gas introducing port 20 is connected to a bifurcated gas introducing tube 22. The gas introducing tube 22 selectively supplies $NH_3$ gas or inert gas $N_2$ to the $NH_3$ buffer nozzle 34 through the first valve 35 and the second valve 36. The gas introduced from the $NH_3$ gas introducing port 20 flows into the gas introducing nozzle portion 28 of the $NH_3$ buffer nozzle 34, and is supplied to the plasma producing nozzle portion 29 through the communication port 30. Here, high frequency electricity is applied between the plasma electrodes 27, plasma 40 is generated in a plasma producing region 46, and $NH_3$ gas is activated by the plasma 40. The activated $NH_3$ gas is injected from the injection hole 45 of the plasma producing nozzle portion 29 onto the wafers 1 in the reaction chamber 12.

Since the $NH_3$ buffer nozzle 34 has the relatively wide nozzle space therein, radicals generated when the gas is activated very little collide against the wall of the nozzle, pressure in the vicinity of the plasma producing region 46 becomes low, this ensures lifetime of the generated radicals, and $NH_3$ radicals can be sent to the reaction chamber (substrate processing region) 12 as they are.

The second gas supply means 70B supplies DCS gas which is one of the two kinds of raw material gases to the reaction chamber 12 from the DCS buffer nozzle 44 as an exclusive supply nozzle. The second gas supply means 70B also supplies $NF_3$ gas which is cleaning gas, DCS gas which is post-processing gas, or inert gas to the reaction chamber 12 from the DCS buffer nozzle 44. The DCS gas and $NF_3$ gas are supplied without being activated unlike the $NH_3$.

Unlike the $NH_3$ buffer nozzle 34, the DCS buffer nozzle 44 does not have a plasma producing nozzle portion, and has only a portion corresponding to the gas introducing nozzle portion 28. Gas is injected from an injection hole 47 of the DCS buffer nozzle 44 onto the wafers 1 in the reaction chamber 12. The g21 is connected to a trifurcated gas introducing tube 23. The trifurcated gas introducing tube 23 selectively supplies DCS gas, $NF_3$ gas or inert gas to the DCS buffer nozzle 44. The trifurcated gas introducing tube 23 comprises gas introducing tubes 23A, 23B and 23C. The gas introducing tube 23A supplies DCS gas. Since it is preferable that the pressure in the reaction tube (this pressure is also called internal pressure of the furnace) rises to a pressure higher than that of $NH_3$ gas within a short time, the DCS gas introducing tube 23A includes a buffer tank 41 for storing DCS gas. The buffer tank 41 is sandwiched between a fourth valve 38 and a sixth valve 43. When DCS gas is to be supplied to the reaction chamber 12, DCS gas is previously stored in the buffer tank 41, the DCS gas stored in the buffer tank 41 is supplied from the buffer tank 41 into the reaction chamber 12 at a stroke in a state in which exhausting operation from the exhaust port 16 of the reaction chamber 12 is stopped for example, and the plurality of wafers 1 in the reaction chamber 12 are exposed to the DCS gas. Since it is preferable that $NF_3$ gas and inert gas are supplied without through the buffer tank 41, the gas introducing tubes 23B and 23C which supplies these gases are connected to the downstream portions of the buffer tank 41.

When the gas introducing tube 23B, the DCS gas introducing port 21 and the DCS buffer nozzle 44 form films on the wafers 1, reaction by-products as accretions adhering to the inner side of the reaction tube 11. A cleaning gas supply system 71 supplies cleaning gas for removing the reaction by-products. After first gas supply means ($NH_3$ gas supply means) 70A and second gas supply means (DCS gas supply means) 70B supply cleaning gas and remove the reaction by-products, a post-processing gas supply system 72 removes F components included in cleaning gas remaining in the reaction tube 11.

Figure 3:
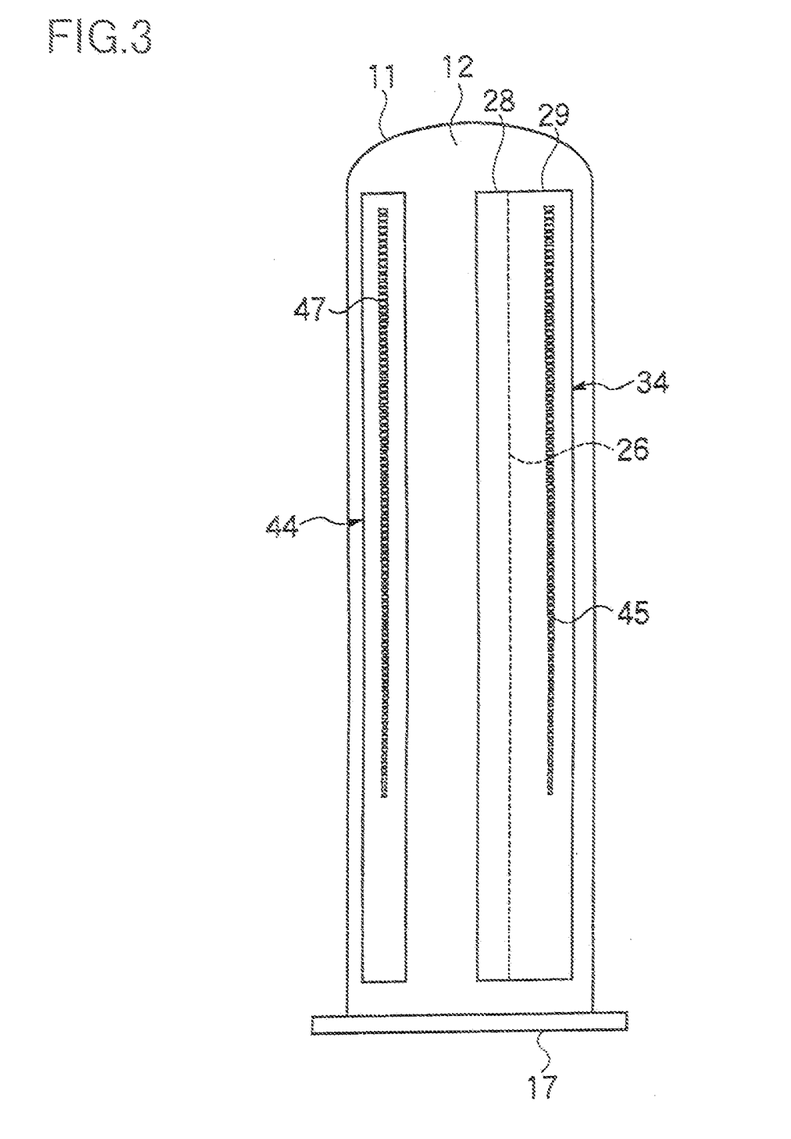
FIG. 3 is a perspective view of a buffer nozzle in a reaction tube according to the embodiment of the invention.

FIG. 3 shows the $NH_3$ buffer nozzle 34 and the DCS buffer nozzle 44 in the reaction tube 11, and is a perspective view of the reaction tube 11 as viewed from the hollow arrow shown at the upper right in FIG. 1. Hole sizes of the gas injection holes 45 and 47 of the buffer nozzles 34 and 44 are increased from upstream portions toward downstream portions of the buffer nozzles 34 and 44. This is because that since the pressure in the nozzle spaces of the buffer nozzles 34 and 44 are decreased from the upstream portions toward the downstream portions, the hole sizes are increased toward the downstream portions so that the injection amount of gases injected from the gas injection holes 45 and 47 is ensured even on the downstream side, and the flow rate is equalized from the upstream portions toward the downstream portions. As described above, the gas injection holes 45 and 47 are provided with the same pitch as adjacent wafers 1 such as to correspond to the large number of wafers 1 held in the multi-stacked manner in the vertical direction.

Next, the operation of the vertical ALD apparatus of the embodiment having the above-described structure will be explained. If the film formation (film forming process A) is repeated in the reaction tube 11 of the vertical ALD apparatus, reaction by-products adhere and remain to the inner side of the furnace. Cleaning (cleaning process B) is carried out to remove the reaction by-products. After the cleaning, post-processing (post-processing process C) for eliminating elements included in the cleaning gas remaining in the furnace is carried out. After the post-processing process C, the film forming process A and the cleaning process B are repeated. These processes will be explained individually. Here, time described in the following explanation is a value from which overhead is subtracted. Here, the overhead means time required for bringing the boat 2 into and out from the reaction tube 11, and time required for evacuation and restoration to normal pressure in the reaction tube. That is, the overhead means time from which time during which gas is introduced into the reaction chamber is subtracted.

Film Forming Process A

This process is an actual film forming process for forming a desired film on a wafer. The boat elevator 55 (FIG. 5) moves the boat 2 down through the seal cap 17, the boat 2 holds a large number of wafers 1, and the boat elevator 55 inserts the boat 2 into the reaction tube 11. The furnace opening of the reaction tube 11 is completely closed by the seal cap 17 air-tightly and then, the reaction tube 11 is evacuated from the exhaust port 16 to exhaust gas from the reaction tube 11. The interior of the reaction tube 11 is heated to a predetermined temperature, e.g., 400 to 600° C. and the temperature is stabilized. While raw material gases are supplied from the two buffer nozzles 34 and 44 into the reaction tube 11, the gases are discharged from the exhaust port 16, and films are formed on the surfaces of the wafers 1.

As described above, the ALD apparatus is designed such that DCS gas and $NH_3$ plasma are alternately supplied from the exclusive supply DCS nozzle and $NH_3$ nozzle. Especially in the case of a vertical ALD apparatus which processes a large number of stacked substrates at a time, in order to equally supply gases to the stacked substrates, buffer nozzles having large nozzle spaces are used as the DCS nozzle and $NH_3$ nozzle instead of normal thin nozzles in some cases. Unlike the DCS buffer nozzle, the $NH_3$ buffer nozzle is provided therein with a having a plasma electrode, and a plasma non-producing region into which $NH_3$ gas is introduced so that $NH_3$ gas introduced into the plasma non-producing region is less prone to be activated by plasma in the plasma producing region. When DCS gas is supplied from the DCS buffer nozzle so that SiN is less prone to be formed in each buffer nozzle, inert gas such as $N_2$ is allowed to flow from the $NH_3$ buffer nozzle, and when $NH_3$ plasma is supplied from the $NH_3$ buffer nozzle, inert gas such as $N_2$ is allowed to flow from the DCS buffer nozzle.

This film forming processing is carried out by ALD film forming processing using two kinds of reaction gases, i.e., DCS and $NH_3$, and comprises the following four steps 1) to 4).

1) High frequency electricity is not applied between the plasma electrodes 27 of the $NH_3$ buffer nozzle 34. To prevent DCS gas from entering into the $NH_3$ buffer nozzle 34, the second valve 36 is opened to allow a small amount of $N_2$ gas to flow. The fourth valve 38 is opened, DCS gas which was previously stored in the buffer tank 41 is supplied to the DCS buffer nozzle 44, and the DCS gas is injected into the reaction chamber 12 from the injection hole 47. The flow rate of the injected DCS is 0.5 slm for example, the exhausting operation of the exhaust port 16 is stopped, and the internal pressure in the furnace is set to 266 to 931 Pa for example. If the wafers 1 are exposed to DCS gas, DCS raw materials adsorb to the wafers 1.

2) The fourth valve 38 is closes and the supply of DCS gas is stopped. The sixth valve 43 is opened, and storing operation of DCS gas into the buffer tank 41 is started. Then, the exhaust port 16 is opened, the fifth valve 39 is opened, and $N_2$ gas which is inert gas is introduced from the DCS buffer nozzle (second buffer nozzle) 44 into the reaction tube 11 to purse the DCS buffer nozzle 44 and the reaction tube 11, thereby eliminating DCS atmosphere from the DCS buffer nozzle 44 and the reaction tube 11. The DCS atmosphere may be eliminated by evacuation instead of $N_2$ purge.

3) To prevent $NH_3$ radical 42 from entering into the DCS buffer nozzle 44, the fifth valve 39 is opened to allow a small amount of $N_2$ gas. High frequency electricity is applied between the plasma electrodes 27, the first valve 35 is opened, and $NH_3$ gas is supplied to the $NH_3$ buffer nozzle (first buffer nozzle) 34. The $NH_3$ gas is introduced into the plasma producing nozzle portion 29 from the gas introducing nozzle portion 28 through the communication port 30, and is activated by plasma 40 generated between the plasma electrodes 27. The activated $NH_3$ radical 42 is injected into the reaction chamber 12 from the injection hole 45. The flow rate of the injected $NH_3$ gas is 3.0 to 4.5 slm for example, and the internal pressure in the furnace is set to 40 to 60 Pa which is lower than the internal pressure when DCS gas is introduced by conductance control of the exhaust port 16. If the wafers 1 are exposed to the activated $NH_3$ gas, the DCS raw material and the $NH_3$ raw material adsorbed to the wafers 1 are reacted with each other, and an SiN film is formed on each wafer 1 by one atom layer.

4) The first valve 35 is closed, the supply of $NH_3$ gas is stopped, and the application of high frequency electricity between the plasma electrodes 27 is stopped. The exhaust port 16 is held opened, the second valve 36 is opened, $N_2$ gas which is inert gas is introduced into the $NH_3$ buffer nozzle 34, the $N_2$ gas is introduced into the reaction tube 11 from the gas introducing nozzle portion 28 through the plasma producing nozzle portion 29, the $NH_3$ buffer nozzle 34 and the reaction tube 11 are purged to eliminate $NH_3$ atmosphere from the $NH_3$ buffer nozzle 34 and the reaction tube 11. The $NH_3$ atmosphere may be eliminated by evacuation instead of $N_2$ purge.

The procedure is returned to the step 1), the steps 1) to 4) are repeated by desired times. If the steps 1) to 4) is defined as one cycle, the film is formed by a constant film thickness in one cycle. Thus, the film thickness can be varied depending upon the number of cycles. The film forming time depends on the film thickness, and if the film forming temperature is 550° C. and the film thickness is 300 Å, the film forming time is about 100 minutes. Although the DCS gas was supplied first and then the $NH_3$ plasma was supplied in the above steps, this supply order may be reversed, and the $NH_3$ plasma may be supplied first and then the DCS gas may be supplied.

After the film forming operation is completed in this manner, gas in the reaction tube 11 is replaced by the inert gas $N_2$, the pressure is restored to the normal pressure, the boat 2 is lowered, and the wafers 1 formed with films are taken out from the boat 2.

However, even if inert gas is allowed to flow from the other buffer nozzle when the raw material gas is allowed to flow from one of the buffer nozzles as described above, it is inevitable that a little gas is mixed between the buffer nozzles by dispersion phenomenon. If DCS gas enters the $NH_3$ buffer nozzle in which raw material gas is activated by plasma, the nozzle becomes a generation source of foreign materials.

Reasons when the nozzle becomes the generation source of foreign materials are as follows:

1) If DCS gas is mixed in the plasma producing region of the $NH_3$ buffer nozzle at the time of plasma discharge, DCS and $NH_3$ plasma react with each other dramatically, polymers are formed and a film adheres to an inner side of the $NH_3$ buffer nozzle. This generates foreign materials.

2) A film adheres to the plasma producing region by the reaction between the DCS and $NH_3$ plasma, if the film adheres thickly, $NH_3$ radicals abruptly collide against the film, the film is damaged and the film may be peeled off. This also generates foreign materials.

In the case of a vertical ALD apparatus using a plurality of exclusive supply buffer nozzles for alternately supplying a plurality of gases, it is necessary that cleaning gas enters the buffer nozzle also in a later-described cleaning process B to eliminate a film in the buffer nozzle.

Cleaning Process B

In a state in which the boat 2 does not hold wafers 1, the boat elevator 55 inserts the boat 2 into the reaction tube 11. The seal cap 17 completely closes the furnace opening of the reaction tube 11 air-tightly and then, the reaction tube 11 is evacuated from the exhaust port 16 to exhaust gas from the reaction tube H. The internal pressure in the reaction tube is set to about 610° C. for example. The third valve 37 is opened, and $NF_3$ gas which functions as cleaning gas is injected into the reaction chamber 12 from the DCS buffer nozzle 44. The flow rate of the injected $NF_3$ gas is 0.25 to 1.5 slm. At that time, evacuation in the reaction tube 11 is continued, and the evacuation degree is controlled such that the internal pressure in the reaction tube 11 becomes equal to a predetermined pressure. $NF_3$ molecules are activated by heat in the furnace. With this, reaction by-products adhering to portions in the furnace which were in contact with the gas, i.e., an inner wall surface of the DCS buffer nozzle 44, an inner wall surface of the reaction tube 11, a low temperature portion of the furnace in the vicinity of the furnace opening 8 and other portions which were in contact are etched. The $NF_3$ gas also enters the $NH_3$ buffer nozzle 34, and reaction by-products in the plasma producing nozzle portion 29 are etched. The etched reaction by-products are discharged out from the exhaust port 16. The cleaning time is varied depending upon the film thickness, but when the film thickness is 0.75 μm, the cleaning time is about two hours.

Here, the inside of the gas introducing nozzle portion 28 of the $NH_3$ buffer nozzle 34 is the plasma non-producing region 48 other than the plasma producing region 46, and if $NF_3$ gas enters the gas introducing nozzle portion 28 and F component adsorbs and bonds to and remains on the inner wall surface of the nozzle, the F component can not be removed because no $NH_3$ plasma exists. Therefore, a very small amount of nitrogen $N_2$ is allowed to flow from the gas introducing nozzle portion 28 at the time of cleaning so that cleaning gas is not mixed in the gas introducing nozzle portion 28. A reason why the amount of nitrogen $N_2$ is very small is as follows. That is, since it is conceived that reaction by-products adhere to the inner side of the plasma producing nozzle portion 29 in some degree by the dispersion of DCS gas, it is necessary to allow cleaning gas to flow into the plasma producing nozzle portion 29 to remove the reaction by-products as described above. Therefore, the amount of nitrogen $N_2$ is increased, the cleaning gas does not enter the plasma producing nozzle portion 29, and the reaction by-products can not be removed. Therefore, the amount of nitrogen $N_2$ is very small to avoid this case.

In this embodiment, the cleaning gas is allowed to flow not from the $NH_3$ buffer nozzle 34 which supplies $NH_3$ gas but from the DCS buffer nozzle 44 which supplies DCS gas. This is because of the following three reasons.

1) It is conceived that since a film can also be formed using DCS gas only, a film of reaction by-product adhering to an inner side of the DCS buffer nozzle 44 is thicker than a film of reaction by-product adhering to the inner side of the $NH_3$ buffer nozzle 34. Therefore, it is necessary to effectively remove the former reaction by-product.

2) If a film is formed after the cleaning, the film forming speed is decreased. This is because that film forming gas is affected by remaining F component and film formation is hindered. When reaction gas is DCS and $NH_3$ plasma, reaction probability between the remaining F and $NH_3$ plasma is higher than that between the remaining F and DCS gas, and $NH_3$ plasma is more susceptible to F. For this reason, when $NH_3$ gas is allowed to flow from the $NH_3$ buffer nozzle 34, the film forming speed is more decreased as compared with a case in which $NF_3$ gas is allowed to flow from the DCS buffer nozzle 44. Thus, it is preferable that gas which is less susceptible to F is allowed to flow first.

3) If cleaning gas enters the $NH_3$ buffer nozzle, F component adsorbs and bonds to the inner wall surface of the $NH_3$ buffer nozzle. If $NH_3$ is not activated by plasma, $NH_3$ does not react with fluorine F. Therefore, when $NF_3$ gas is supplied from the $NH_3$ buffer nozzle 34, if F component adsorbs and bonds to and remains in the plasma non-producing region 48 other than the plasma producing region 46, this F component can not be removed. Thus, it is necessary to keep supplying F into the reaction chamber 12 for a while after wafer processing is started, and the film forming speed is not stabilized for a while. It is necessary to avoid such a case.

Post-Processing Process C

The post-processing process is carried out after the cleaning process. The post-processing process comprises a removing process for removing element F remaining in the buffer nozzles 34 and 44 and the reaction chamber 12 from the reaction tube 11, and a film-preformation process for forming desires films on constituent surfaces in the buffer nozzles 34 and 44 and the reaction tube 11. These two removing process and the film-preformation process may be independent different processes, but if the ALD method is used, both the processes can be carried out as one process. The film-preformation procedure when the two processes are carried out as one process using the ALD method is basically the same as the above-described film forming process A, and is different from the film forming process A in that the processing time is as short as about 13 minutes. If the film formation of about 40 cycles is carried out with this processing time, it is possible to stabilize the film thickness of the wafer film formation which is carried out after the post-processing.

If the post-processing process is carried out using the ALD method in which $NH_3$ radical activated by plasma and DCS gas are alternately supplied, F component on portions in the furnace which are in contact with gas are removed as in the following manner.

1) $NH_3$ buffer nozzle $NH_3$ gas is supplied to the $NH_3$ buffer nozzle 34 as post-processing gas. Then, since the $NH_3$ is activated by plasma, F component which adsorbs and bonds to and remained on the wall surface of the plasma producing nozzle portion 29 of the $NH_3$ buffer nozzle 34 reacts with H atom which is ionized from the $NH_3$ by the activation, and they become HF which is easily be discharged from the $NH_3$ buffer nozzle 34. The HF gas is discharged from the exhaust port 16 of the reaction tube 11 from the $NH_3$ buffer nozzle 34 through the reaction chamber 12. Further, at the time of film-preformation, an SiN film which is a preformed film is not intentionally formed in the NH$_3$ buffer nozzle 34, but since a certain amount of DCS gas flows into the NH$_3$ buffer nozzle 34 by the dispersion effect of gas when the DCS gas is supplied, it is conceived that a certain amount of preformed SiN film is formed in the NH$_3$ buffer nozzle 34. Therefore, F component which adsorbs and bonds to and remains on the wall surface of the NH$_3$ buffer nozzle 34 is discharged from the atmosphere in the reaction tube by the reaction with respect to these film raw materials and by encapsulation under the films. At the time of cleaning, a very small amount of nitrogen N$_2$ is allowed to flow into the gas introducing nozzle portion 28 where no NH$_3$ radical is produced so that F component is mixed. Therefore, it is unnecessary to suppress the F component by removing the same by NH$_3$ radical or by film-preformation.

2) DCS buffer nozzle

DCS gas is supplied to the DCS buffer nozzle 44 as post-processing gas. Then, since this DCS (SiH$_2$Cl$_2$) gas can easily form Si—F bond, F component which adheres to and remains on the wall surface of the DCS buffer nozzle 44 reacts with DCS gas and they become SiF (silicon fluoride) gas. This SiF gas is discharged from the exhaust port 16 of the reaction tube 11 through the reaction chamber 12 from the DCS buffer nozzle 44. An SiN film which is a preformed film is not intentionally formed in the DCS buffer nozzle 44 when the film is to be preformed, but since a small amount of NH$_3$ radical flows into the DCS buffer nozzle 44 by the dispersion effect of gas when NH$_3$ radical is supplied, it is conceived that a small amount of preform SiN film is formed in the DCS buffer nozzle 44. Therefore, F component which adheres to and remains on the wall surface of the DCS buffer nozzle 44 is discharged from the atmosphere in the reaction tube by the reaction with respect to these film raw materials and by encapsulation under the films.

3) Low temperature portion of furnace

A reaction probability between F component which adsorbs and bonds to and remains on a low temperature portion of the furnace (furnace low temperature portion, hereinafter) in the vicinity furnace opening 8 and NH$_3$ radical supplied from the NH$_3$ buffer nozzle 34 into the reaction chamber 12 is also high. Therefore, the NH$_3$ radical especially effectively functions, the F component becomes HF and if discharged from the reaction tube 11. Since the NH$_3$ radical and DCS gas are alternately supplied into the reaction tube 11 from the buffer nozzles 34 and 44, F component which adsorbs and bonds to and remains on the wall surface is encapsulated under the film also by the preformed film formed on the furnace low temperature portion, and the F component is discharged from the atmosphere in the reaction tube.

4) Portions other than those described above

Portions in the furnace which are in contact with gas other than portions in the furnace described above can suppress the F component which adsorbs and bonds to and remains on the wall surface by volatilization of F component due to film-preformation and reaction with respect to DCS gas or NH$_3$ gas, and can discharge the F component.

By the above-described removing effects 1) to 4), F component on the portions in the furnace which are in contact with gas can effectively be removed. Thus, even immediately after the cleaning, F component is separated and does not hinder the film formation when a film is to be formed on a substrate, and reduction in film forming speed can effectively be prevented.

According to the embodiment, as described above, the ALD method is employed instead of the thermal CVD method when the film-preformation which is the post-processing process is to be carried out, and all of raw material gases to be used for actual film formation are supplied to the post-processing process at that time. Therefore, it is possible to remove F element from the furnace by the NH$_3$ radical and DCS, and to trap F element in the furnace by the film-preformation and thus, it is possible to effectively eliminate F element from the atmosphere in the reaction tube.

When a film is to be preformed by the thermal CVD method, a thick film is required for trapping F component. That is, in the case of the thermal CVD method, the film forming speed is slow in the low temperature portion in the vicinity of furnace opening 8 as compared with other portions in the furnace which are in contact with gas. Therefore, if a film is preformed for trapping the F component based on the low temperature portion, the film forming time is increased, and the thickness of a film at other portion of furnace which is in contact with gas is increased. Further, since plasma is not used in the thermal CVD method, the thermal CVD method does not have a function for discharging remaining F component from the reaction chamber 12 by NH$_3$ plasma. It is necessary to encapsulate a large amount of remaining F component under the preformed film and as a result, a thick preformed film is required. On the other hand, in the case of a preformed film formed by the ALD method as in the embodiment, a thin film suffices to trap F component. That is, in the case of the ALD method, since NH$_3$ plasma effectively removes reaction chamber remaining in the vicinity of the low temperature portion, it is only necessary to preform a thin film. When the preformed film is thin, time required until reaction by-product adhering to the inner wall surface of the reaction tube starts peeling off by the subsequent substrate processing becomes long, and the number of cleaning operations can be reduced.

Figure 4A:
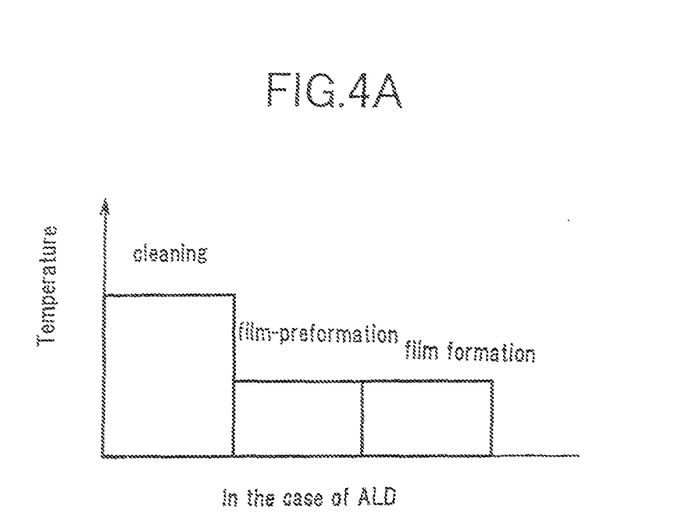
FIGS. 4A and 4B show comparison of processing temperatures of cleaning, film-preformation, film formation when an ALD method and a thermal CVD method are employed for film-preformation.
Figure 4B:
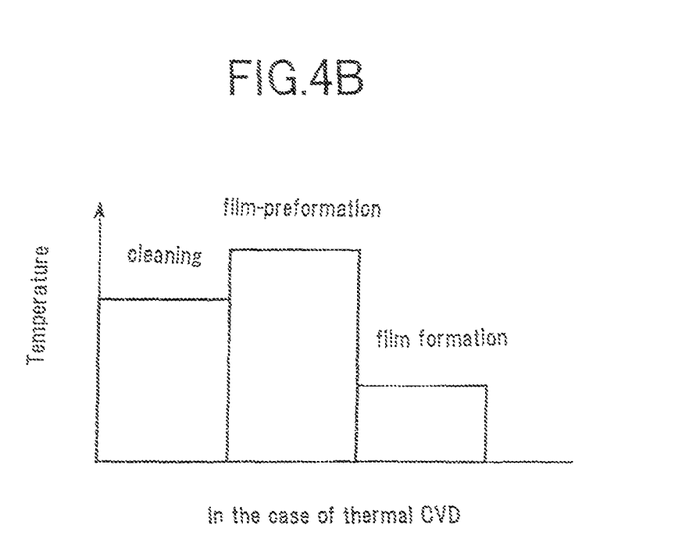

Therefore, as shown in FIGS. 4A and 4B, when a film is to be preformed, a thick film is required if the thermal CVD method is used as in the conventional technique, and it is necessary to increase the processing temperature to increase the film forming speed (FIG. 4B). On the other hand, since the embodiment uses the ALD method, a thin film can be preformed by the removing effect of remaining F component by NH$_3$ plasma and DCS gas. Thus, the film-preformation temperature can be the same as the film formation temperature of the actual film, and throughput can be enhanced (FIG. 4A).

Further, according to the embodiment, the NH$_3$ buffer nozzle and the DCS gas buffer nozzle which are exclusive supply nozzles are utilized as they are as post-processing gas supply system which supplies post-processing gas, and it is unnecessary to add a thermal CVD film forming nozzle in addition to the exclusive supply nozzle. Thus, the structure of the reaction tube does not become complicated, and costs are not increased. Since the thermal CVD film forming nozzle is not added, foreign materials are not generated by the film formation in the CVD film forming nozzle.

If a substrate processing apparatus which uses the above-described film forming process, cleaning process and post-processing process is used, it is possible to produce a semiconductor device which is less affected by element included in cleaning gas remaining in a reaction chamber.

Although the SiN film was formed using DCS and NH$_3$ activated by plasma as raw material gases, the kinds of gases are not limited to those. For example, the SiN film can also be formed using Si$_2$Cl$_6$ (hexachloro disilane: HCD) and NH$_3$ (it may be or may not be activated by plasma) as raw material gases.

Although NF$_3$ was used as cleaning gas in this embodiment, etching gas including other F (fluorine) such as ClF$_3$ may also be used.

Although the actual film forming operation and the post-processing process are carried out by the ALD method in the embodiment, the invention is not limited to this. For example, the actual film forming operation may be carried out by the thermal CVD method, and only the post-processing process may be carried out by the ALD method. Although the present invention is applied to the batch type vertical ALD apparatus in the embodiment, the invention can also be applied to a single wafer type ALD apparatus.

Although two buffer nozzles having large space capacities as compared with a normal nozzle are used and gas is activated by plasma in one of the buffer nozzles in the embodiment, the invention is not limited to this structure. For example, although the processing time of the post-processing process is increased, the present invention can also be applied to a structure in which gas is activated by plasma outside of the buffer nozzle, or a normal thin nozzle is used and gas is activated by plasma outside of the nozzle.

The entire disclosure of Japanese Patent Application No. 2002-327193 filed on Nov. 11, 2002 including specification, claims, drawings and abstract is incorporated herein by reference in its entirety.

Industrial Applicability

According to the preferred embodiment of the invention as described above, since reaction gas is used as post-processing gas carried out after the cleaning, element included in the cleaning gas can effectively be removed. If all reaction gases used when a substrate is subjected to desired processing are introduced as post-processing gases, it is unnecessary to add a gas supply system, and it is possible to prevent the structure from becoming complicated. Further, foreign material from a gas supply system generated when the gas supply system is added can be prevented from being generated.

As a result, the present invention can suitably be utilized especially for a substrate processing apparatus which forms a film on a semiconductor substrate by the ALD (Atomic Layer Deposition) also.

The invention claimed is:

1. A semiconductor device producing method comprising:
   transferring a substrate into a processing chamber;
   thereafter forming a silicon nitride film on the substrate by repeating the following a plurality of times in the following order:
      supplying a gas including silicon into the processing chamber,
      exhausting the processing chamber,
      supplying a plasma-activated ammonia gas into the processing chamber, and
      exhausting the processing chamber;
   thereafter transferring the substrate out of the processing chamber;
   thereafter removing accretion that has been adhered to an inside of the processing chamber by supplying a cleaning gas including fluorine into the processing chamber; and
   thereafter removing fluorine included in the cleaning gas remaining in the processing chamber and forming a silicon nitride film inside the processing chamber by repeating the following a plurality of times:
      supplying the gas including silicon into the processing chamber,
      exhausting the processing chamber,
      supplying the plasma-activated ammonia gas into the processing chamber, and
      exhausting the processing chamber, wherein
   the gas including silicon and the plasma-activated ammonia gas are respectively supplied from first and second nozzles, the first and second nozzles being independently and exclusively connected to the processing chamber,
   the cleaning gas is supplied from the first nozzle and is not supplied from the second nozzle,
   an inert gas is supplied from the second nozzle while supplying the cleaning gas, and wherein
   a temperature in the processing chamber when removing fluorine included in the cleaning as remaining in the processing chamber and forming the silicon nitride film inside the processing chamber is lower than a temperature in the processing chamber when supplying the cleaning gas into the process chamber,
   the temperature in the processing chamber when removing fluorine included in the cleaning as remaining in the processing chamber and forming the silicon nitride film inside the processing chamber is the same as a temperature in the processing chamber when forming the silicon nitride film on the substrate, and
   a time for removing fluorine included in the cleaning as remaining in the processing chamber and forming the silicon nitride film inside the processing chamber is shorter than a time for forming the silicon nitride film on the substrate.

2. The semiconductor device producing method according to claim 1, wherein the plasma-activated ammonia gas reacts with fluorine included in the cleaning gas remaining in the processing chamber.

3. The semiconductor device producing method according to claim 2, wherein a reaction probability between the plasma-activated ammonia gas and fluorine is higher than a reaction probability between the gas including silicon and fluorine.

* * * * *